US012800661B2

(12) United States Patent
Kim et al.

(10) Patent No.: US 12,800,661 B2
(45) Date of Patent: Nov. 17, 2026

(54) JIG FOR SECONDARY BATTERY CELL TEST

(71) Applicant: WONIK PNE CO., LTD., Suwon-si (KR)

(72) Inventors: Youngseok Kim, Suwon-si (KR); Dongjin Park, Suwon-si (KR)

(73) Assignee: WONIK PNE CO., LTD., Suwon-si (KR)

( * ) Notice: Subject to any disclaimer, the term of this patent is extended or adjusted under 35 U.S.C. 154(b) by 136 days.

(21) Appl. No.: 18/889,211

(22) Filed: Sep. 18, 2024

(65) Prior Publication Data

US 2025/0093419 A1 Mar. 20, 2025

(30) Foreign Application Priority Data

Sep. 19, 2023 (KR) ........................ 10-2023-0124441

(51) Int. Cl.
*G01R 31/36* (2020.01)
*G01R 31/378* (2019.01)

(52) U.S. Cl.
CPC ....... *G01R 31/3644* (2013.01); *G01R 31/378* (2019.01)

(58) Field of Classification Search
CPC .......................... G01R 31/3644; G01R 31/378
See application file for complete search history.

(56) References Cited

FOREIGN PATENT DOCUMENTS

| | | | | |
|---|---|---|---|---|
| KR | 10-2020-0027250 A | | 3/2020 | |
| KR | 20220001221 A | * | 1/2022 | ........... G01R 31/382 |
| KR | 10-2022-0001221 A | | 5/2022 | |

OTHER PUBLICATIONS

Korean Office Action dated Oct. 15, 2025 as received in application No. 10-2023-0124441.

* cited by examiner

*Primary Examiner* — Minh Q Phan
(74) *Attorney, Agent, or Firm* — Maschoff Brennan

(57) ABSTRACT

Disclosed is a jig for a secondary battery cell test, which can perform charging and discharging tests on various types of secondary battery cells by using one jig structure. The jig includes a main body, a first connection unit disposed in the main body and connected to a secondary battery cell, a second connection unit disposed to face the first connection unit, installed to be movable so that the second connection unit becomes close to or distant from the first connection unit, and connected to the secondary battery cell, a third connection unit disposed to neighbor the first connection unit and connected to the secondary battery cell, and a flexible connection unit including at least one flexible busbar that is deformable and configured to connect the second connection unit and the third connection unit so that the second connection unit and the third connection unit are electrically conductable.

9 Claims, 10 Drawing Sheets

[FIG. 1]
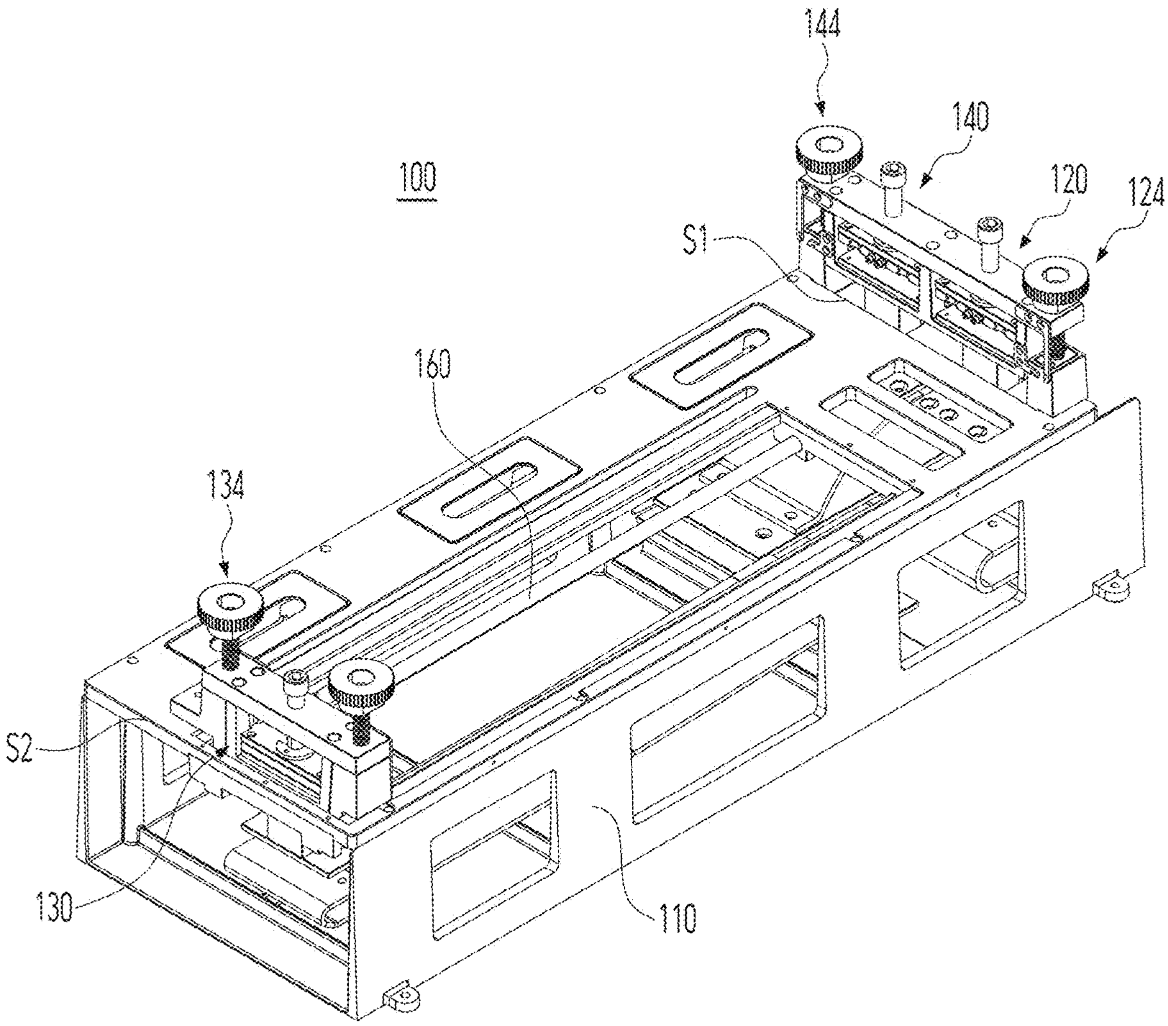

[FIG. 2]
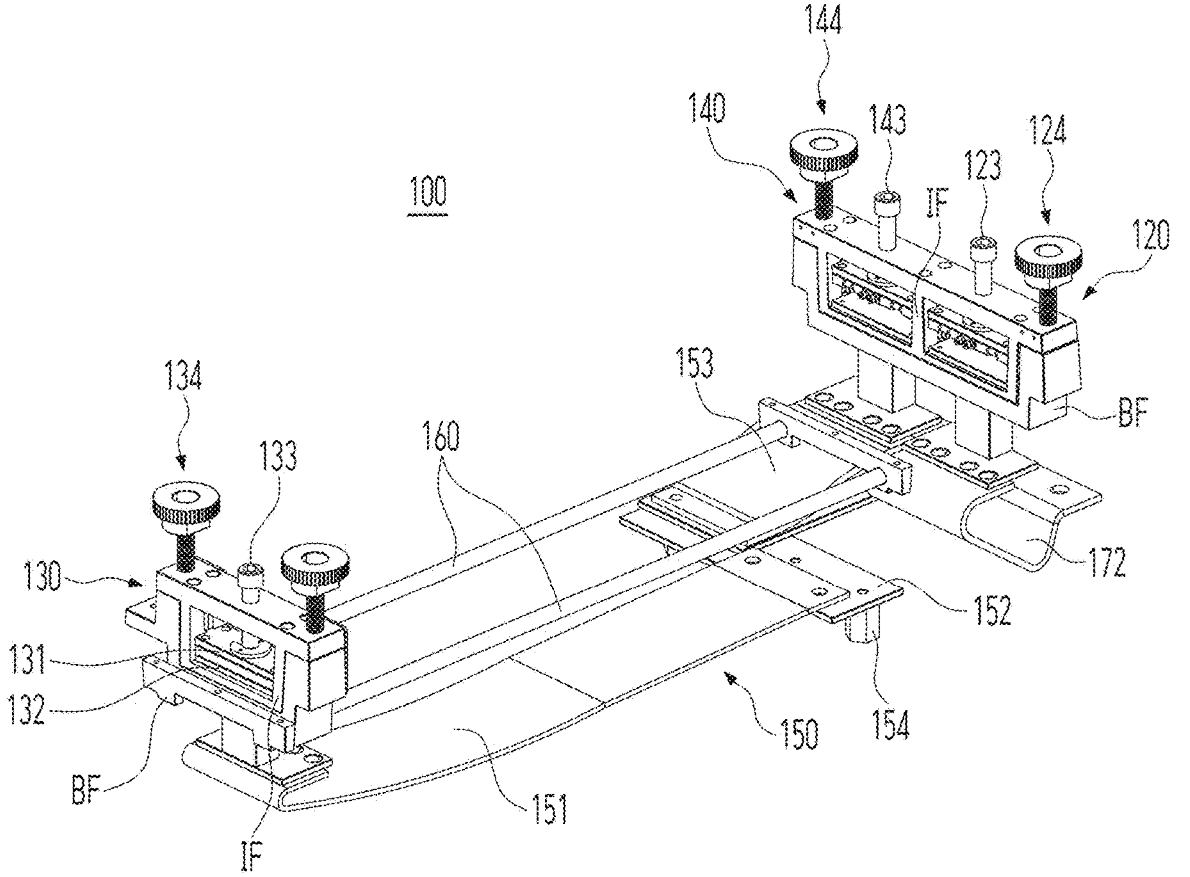

[FIG. 3]
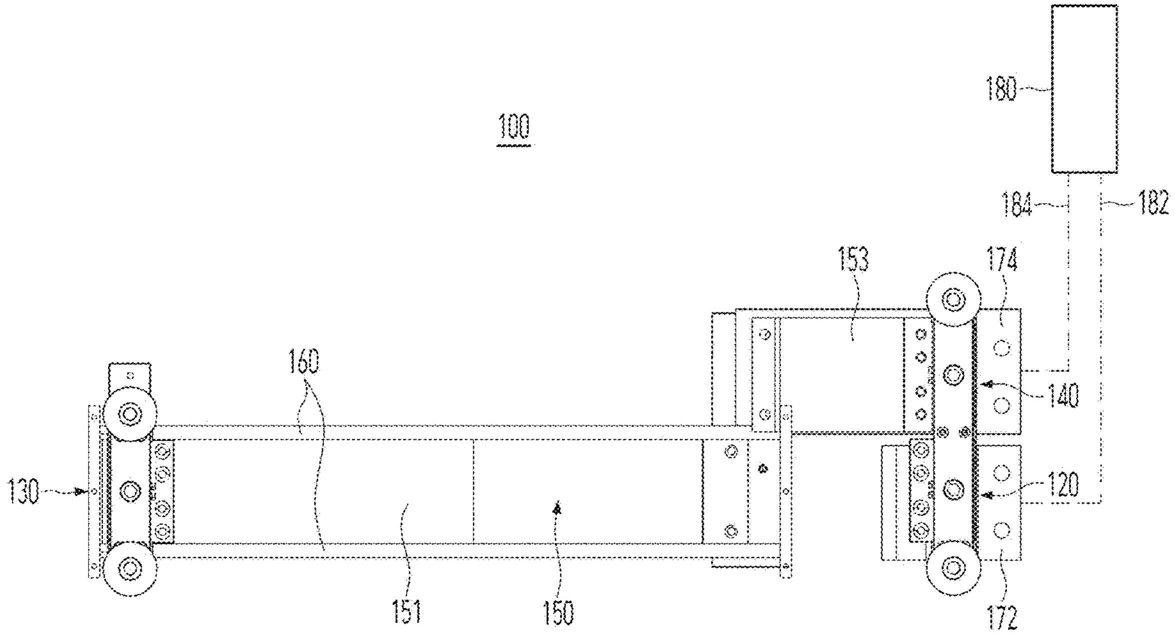

[FIG. 4]
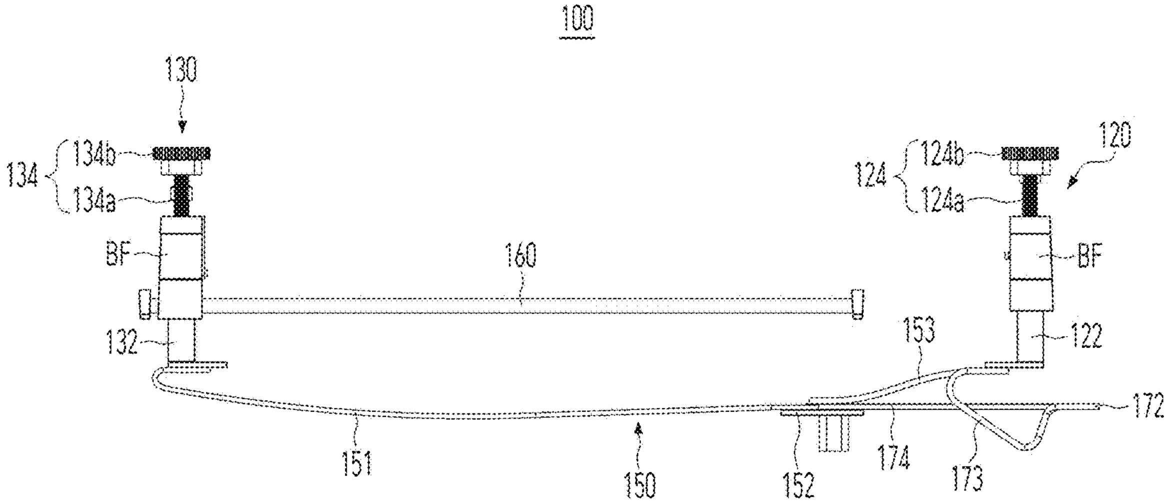

[FIG. 5]
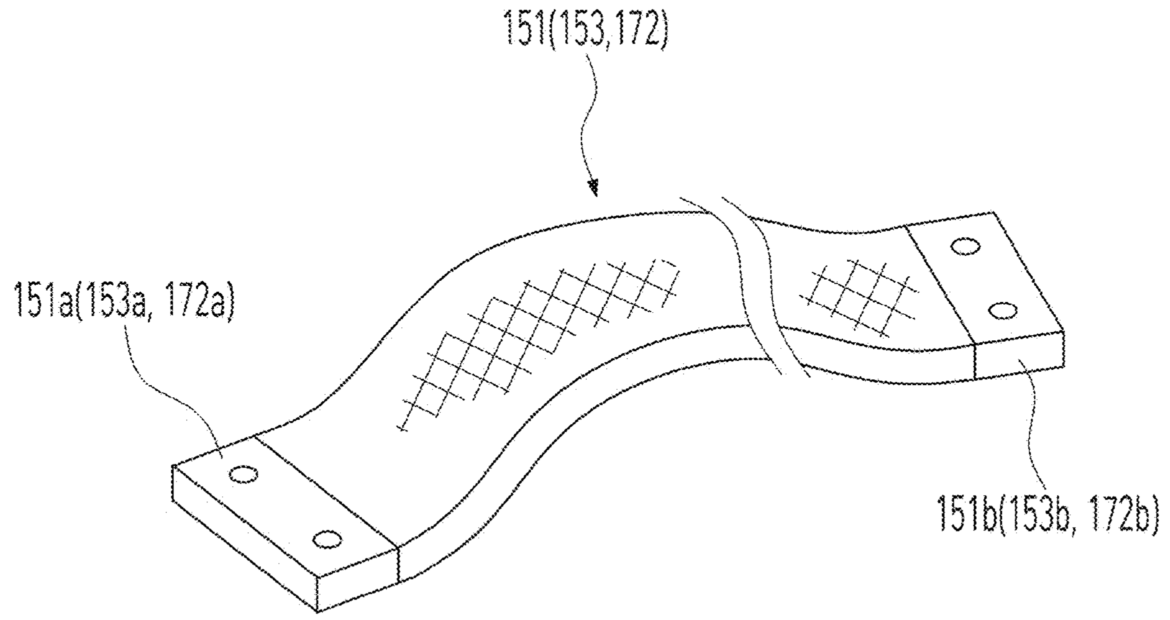

[FIG. 6]
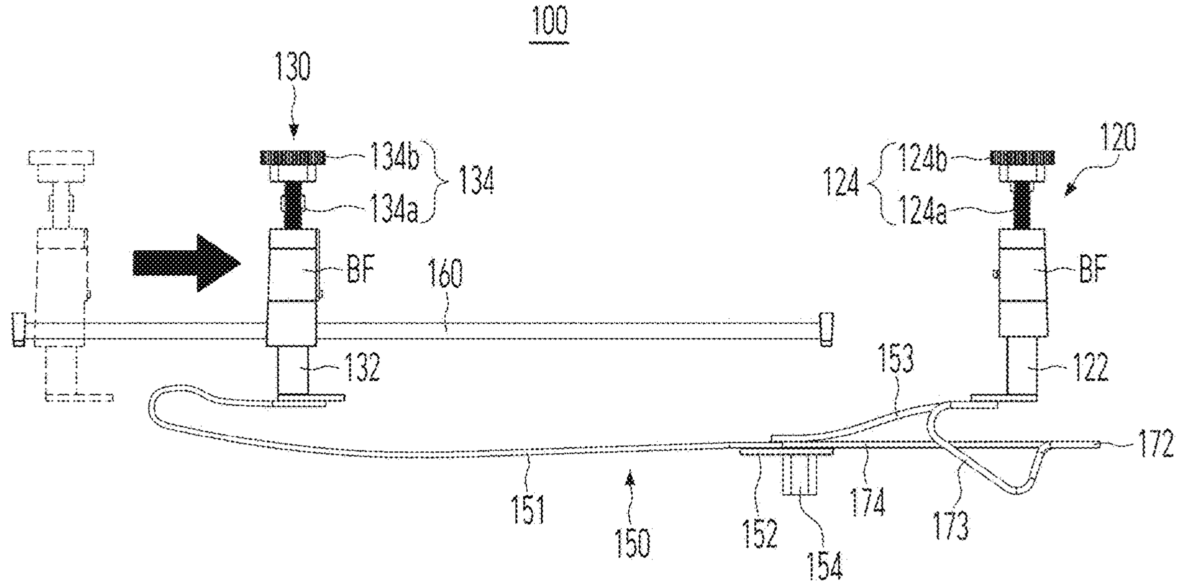

[FIG. 7]
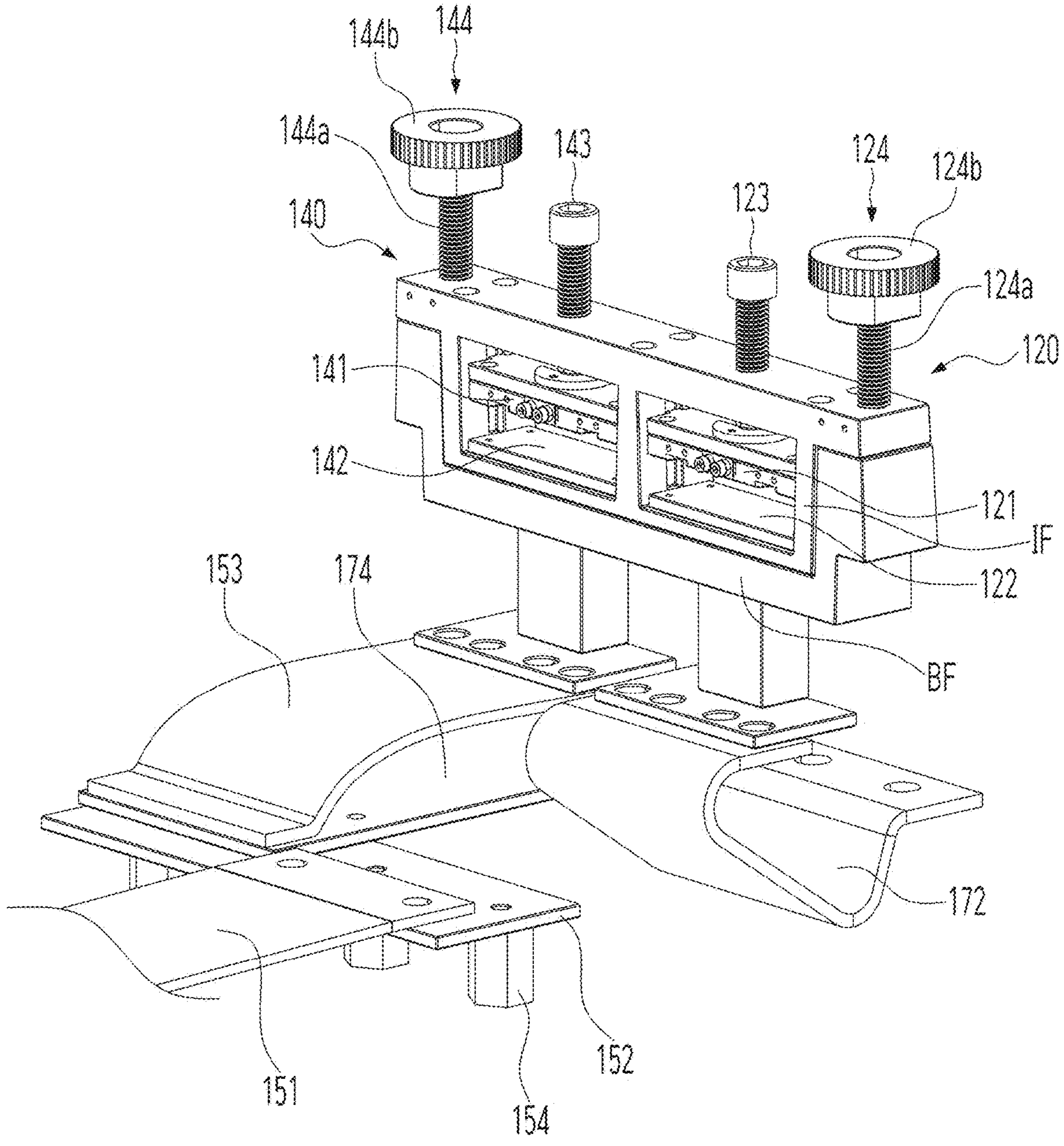

[FIG. 8]
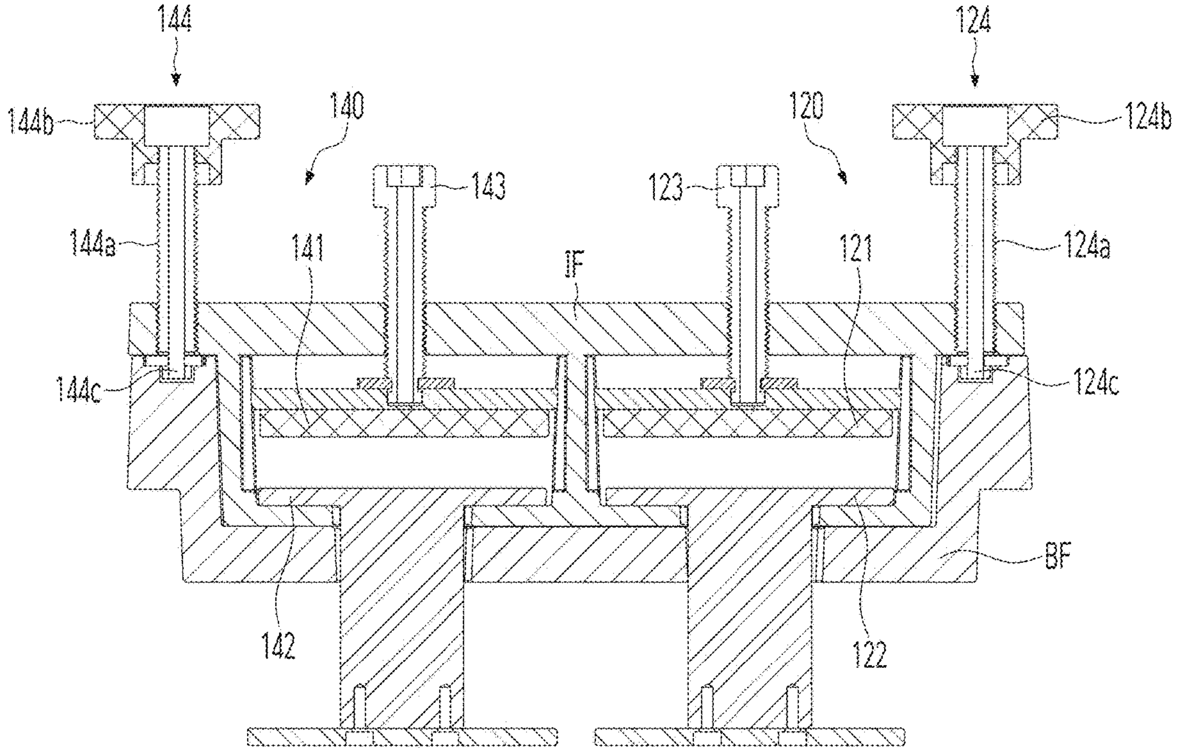

[FIG. 9]
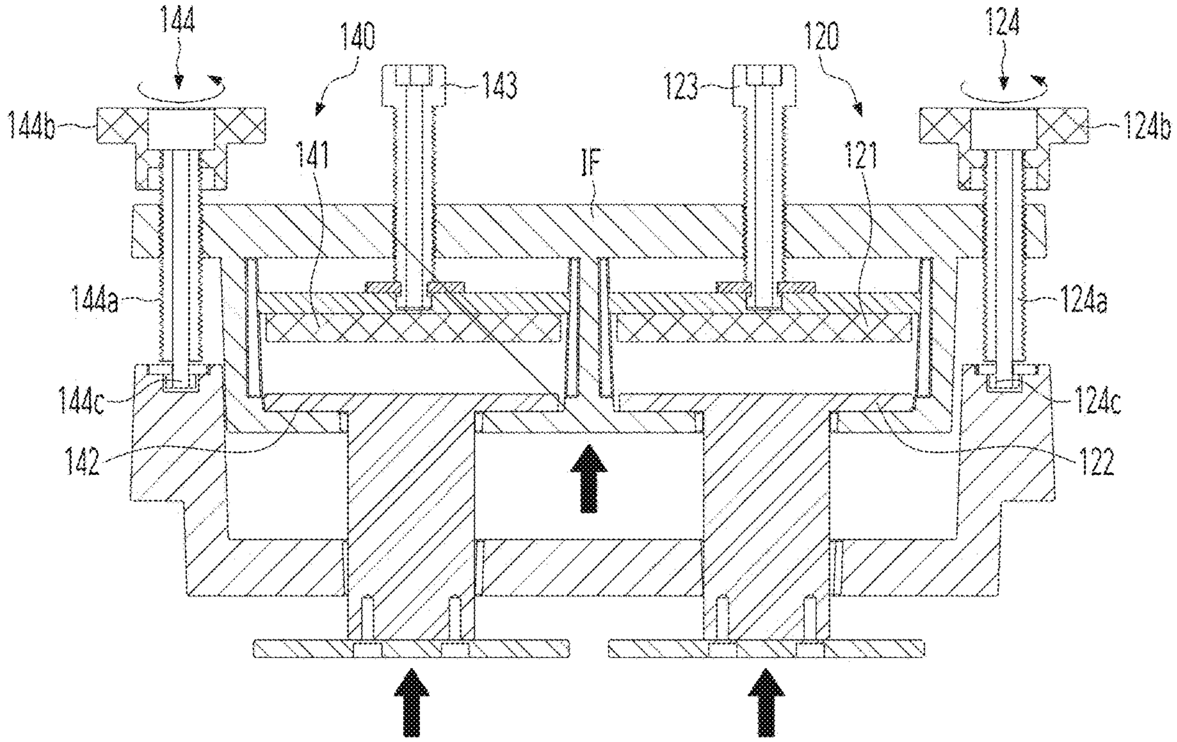

[FIG. 10]
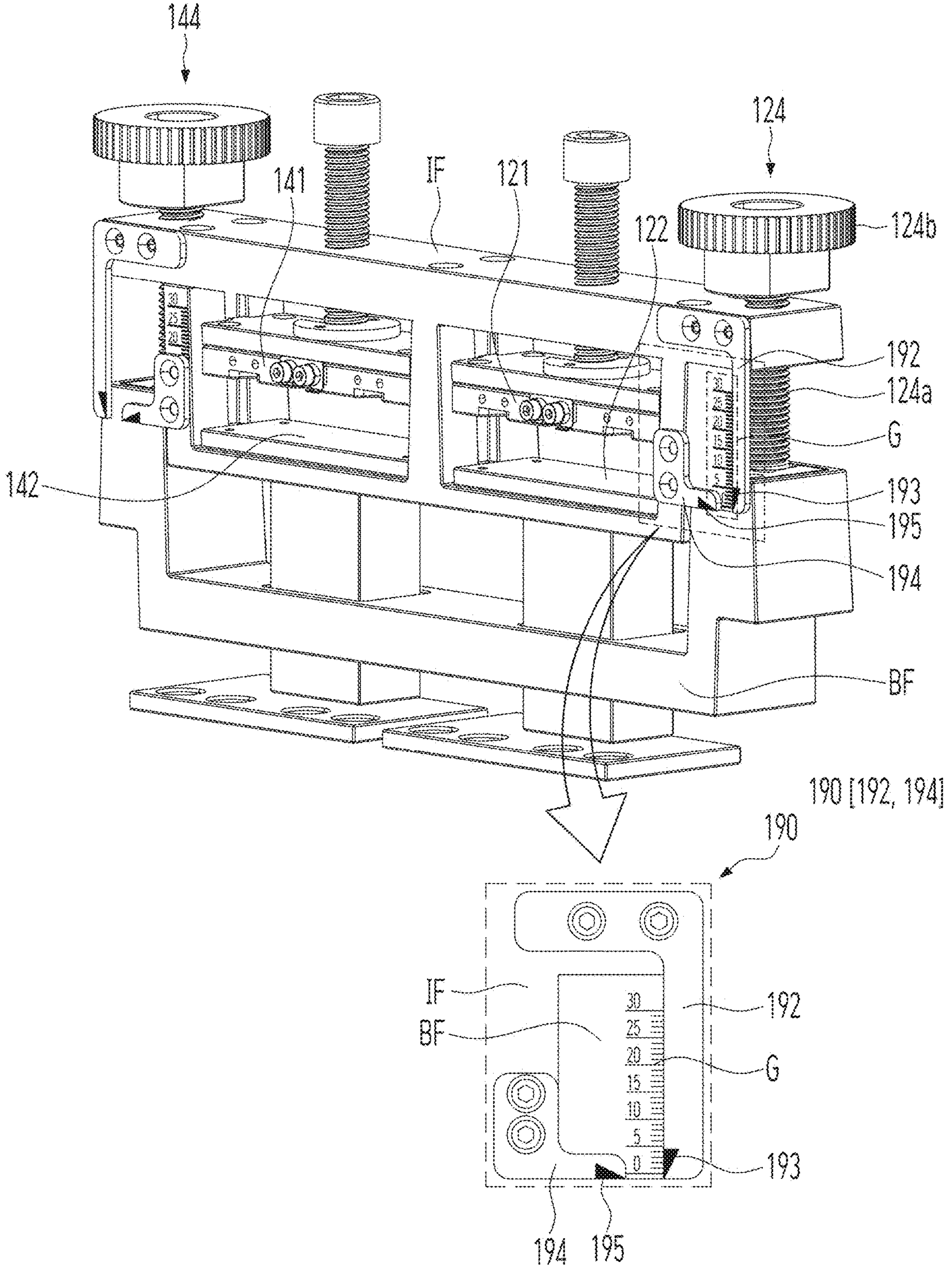

JIG FOR SECONDARY BATTERY CELL TEST

TECHNICAL FIELD

The present disclosure relates to a jig for charging and discharging tests on a secondary battery cell, and more particularly, to a jig for a secondary battery cell test, which can perform charging and discharging tests on various types (or specifications) of secondary battery pouch cells by using one jig for tests.

BACKGROUND ART

A secondary battery may be divided into a cylindrical type, a prismatic type, and a pouch type depending on its form. In early days, the cylindrical type secondary battery was mainstream, but the use of the prismatic type secondary battery or the pouch type secondary battery that is advantageous in weight lightening, has high energy density, and can be fabricated in various sizes is recently increased. In particular, the prismatic type and pouch type secondary batteries have advantages in that space utilization is increased and more flexibility can be allowed in their designs.

A charging and discharging characteristic test for testing performance, the lifespan, and safety of the secondary battery, while repeating a step of charging and discharging the secondary battery during a process of releasing the secondary battery as a product, is performed on the secondary battery. Such a secondary battery charging and discharging characteristic test is a very important process of determining the quality of the secondary battery.

In order to perform the charging and discharging characteristic test on the secondary battery, a secondary battery charging and discharging-dedicated jig is used. The secondary battery is charged and discharged by applying a current to the secondary battery through a charger and discharger, in the state in which the secondary battery has been held in the jig and the electrode tab of the secondary battery has been connected to the current terminal of the jig.

Such a jig for the secondary battery charging and discharging test needs to be fabricated so that tests can be performed on a unidirectional secondary battery in which the electrode tabs of the secondary battery are disposed in the same direction and a bidirectional secondary battery in which the electrode tabs of the secondary battery are disposed in directions in which the electrode tabs face each other. Furthermore, there is a need for the development of a jig for charging and discharging tests, which can perform charging and discharging tests by connecting various types (or specifications) of secondary batteries to the jig because the design specifications of the secondary battery, such as a length or a thickness, are various depending on places where the secondary battery is used.

DOCUMENTS OF RELATED ART

Patent Document (Patent Document 1) Korean Patent Application Publication No. 2020-0027250 (Mar. 12, 2020)

SUMMARY OF INVENTION

Technical Problem

An object of the present disclosure is to provide a jig for a secondary battery cell test, which can perform charging and discharging tests on various types (or specifications) of secondary battery cells by using one jig for charging and discharging tests.

Solution to Problem

According to an embodiment of the present disclosure, there is provided a jig for a secondary battery cell test, including a main body, a first connection unit disposed in the main body and connected to a secondary battery cell, a second connection unit disposed to face the first connection unit, installed to be movable so that the second connection unit becomes close to or distant from the first connection unit, and connected to the secondary battery cell, a third connection unit disposed to neighbor the first connection unit and connected to the secondary battery cell, and a flexible connection unit including at least one flexible busbar that is deformable and configured to connect the second connection unit and the third connection unit so that the second connection unit and the third connection unit are electrically conductable.

The flexible connection unit may include a first flexible busbar configured to be deformable and to have one end connected to the second connection unit and the other end connected to a conductive plate that is fixed to an upper part of a bottom of the main body, and a second flexible busbar configured to be deformable and to have one end connected to the third connection unit and the other end connected to the conductive plate.

Furthermore, the jig for a secondary battery cell test may further include a third flexible busbar disposed under the first connection unit and configured to be deformable and to have one end connected to an external charger and discharger and the other end connected to the first connection unit.

Furthermore, the jig for a secondary battery cell test may further include a connection plate disposed under the third connection unit and configured to have one end connected to an external charger and discharger and the other end connected to the third connection unit.

Furthermore, the jig for a secondary battery cell test may further include a pair of guide shafts installed in the length direction of the main body and configured to provide guidance to a movement of the second connection unit.

Furthermore, each of the first to third connection units may include an upper gripper and a lower gripper configured to come into contact with a terminal of the secondary battery cell on upper and lower parts thereof, respectively, a gripper mounting frame in which the lower gripper is seated and with which the upper gripper is coupled so that the upper gripper is movable up and down, a base frame through which the lower gripper penetrates and with which the gripper mounting frame is coupled so that the gripper mounting frame is movable up and down, and a gripper mounting frame height adjustment member configured to adjust an up and down height of the gripper mounting frame with respect to the base frame.

In this case, the gripper mounting frame height adjustment member may include a bolt shaft configured to have a screw thread formed on an outer circumferential surface thereof, screwed onto the gripper mounting frame, and configured to have a bottom rotatably supported by the base frame, and a rotary knob coupled with a top of the bolt shaft in an upper part of the gripper mounting frame.

Furthermore, a gradation through which the height of the gripper mounting frame according to the up and down movement of the gripper mounting frame is able to be checked may be formed on an external surface of the base frame.

Furthermore, an indication member to indicate a location of a gradation formed on an external surface of the base frame may be mounted on the gripper mounting frame.

In this case, the indication member may include a first indication member disposed in parallel to a moving direction of the gripper mounting frame and configured to indicate the location of the gradation, and a second indication member that is disposed to be perpendicular to the first indication member and through which the location of the gradation and a horizontal state of the gripper mounting frame are able to be checked.

Advantageous Effects of Invention

The jig for a secondary battery cell test according to an embodiment of the present disclosure has an advantage in that charging and discharging tests can be easily performed on secondary battery pouch cells having various specifications by using one jig for charging and discharging tests.

Furthermore, the jig for a secondary battery cell test according to an embodiment of the present disclosure has an advantage in that charging and discharging tests can be performed on secondary battery cells having various thicknesses by connecting a secondary battery cell, such as a secondary battery cell having a barrier rib that maintains an interval between unit batteries or a secondary battery cell not having the barrier rib, to the contact part of the jig, regardless of whether the barrier rib is present, because the contact part of the jig connected to the electrode terminal of the secondary battery cell has a structure in which the contact part is freely adjusted in the vertical direction.

Furthermore, the jig for a secondary battery cell test according to an embodiment of the present disclosure can perform charging and discharging tests on a secondary battery cell always stably, because the flexible busbar can absorb a movement displacement of each connection unit, while being deformed during a process of the connection unit of the jig, which is connected to the positive electrode terminal or negative electrode terminal of the secondary battery cell, being moved in the horizontal direction or vertical direction of the jig, and can continuously maintain the state in which the flexible busbar has been electrically connected to the connection unit. Accordingly, it is possible to prevent a connection failure between the connection unit and the busbar during a process of the connection unit sliding and moving.

In particular, the existing jig structure in which the connection unit of the jig that is connected to the terminal of a secondary battery cell is moved in the horizontal direction, while physically coming into contact with the top of the busbar having a flat plate form, has a problem in that a connection failure occurs because a deviation occurs in contact resistance between the connection unit and the busbar due to poor flatness of the busbar or an assembly tolerance between parts. In contrast, the jig for a secondary battery cell test according to an embodiment of the present disclosure has an advantage in that charging and discharging tests can be always stably performed on a secondary battery cell because the flexible busbar always maintains an electrical connection with the connection unit while connection unit is moved in the horizontal direction.

Furthermore, in the jig for a secondary battery cell test according to an embodiment of the present disclosure, the connection unit can always stably slidably move along a predetermined movement path without being moved left and right or up and down during a process of the connection unit being moved in the horizontal direction because the connection unit is constructed to slidably move along the pair of guide shafts that is installed in the length direction of the main body. Accordingly, it is possible to improve the mobility of the connection unit and to also improve current connectivity and test workability according to the improved mobility.

Furthermore, the jig for a secondary battery cell test according to an embodiment of the present disclosure has effects in that a charging and discharging characteristic test can be performed on a secondary battery cell from a low current band to a high current band through the flexible busbar and in particular, efficiency of a driving space can be improved through an optimized size which may be applied when a high current band is measured.

Furthermore, the jig for a secondary battery cell test according to an embodiment of the present disclosure has effects in that charging and discharging tests can be performed by connecting various types of secondary battery cells to the connection unit regardless of the height of the terminal of a secondary battery cell because the height of the gripper that is engaged with the terminal of the secondary battery cell can be freely adjusted through the rotary knob included in the connection unit, and workability according to the charging and discharging tests can also be improved.

Furthermore, in the jig for a secondary battery cell test according to an embodiment of the present disclosure, when the height of the gripper is adjusted by using the rotary knob, the heights of the grippers in the vertical direction, which are included in the connection units, respectively, can be accurately adjusted through the indication member mounted on the gripper mounting frame, while accurately checking the location of the gradation on the external surface of the base frame. Accordingly, it is possible to reduce the time taken for setting work for charging and discharging tests on a secondary battery cell, to improve workability for the charging and discharging tests, and to enable more reliable test work.

BRIEF DESCRIPTION OF DRAWINGS

FIG. 1 is a perspective view illustrating an appearance structure of a jig for a secondary battery cell test according to an embodiment of the present disclosure.

FIG. 2 is a perspective view illustrating major components of the jig for a secondary battery cell test according to an embodiment of the present disclosure.

FIG. 3 is a plan view of the jig in FIG. 2, which is viewed from the top thereof.

FIG. 4 is a side view of the jig in FIG. 2, which is viewed from the side thereof.

FIG. 5 is an exemplary diagram illustrating a structure of a flexible busbar according to an embodiment of the present disclosure.

FIG. 6 is an operation state diagram illustrating a form in which a second connection unit has been moved toward a first connection unit along a guide shaft at a predetermined distance.

FIG. 7 is a detailed diagram specifically illustrating connection structures of first to third flexible busbars.

FIG. 8 is a cross-sectional view illustrating cross section forms of a first connection unit and a third connection unit.

FIG. 9 is an operation diagram illustrating a form in which the height of a gripper mounting frame is adjusted by the rotation of a rotary knob.

FIG. 10 is an exemplary diagram illustrating a structure in which an indication member to indicate the gradation of a base frame has been installed when the height of the gripper mounting frame is adjusted.

DESCRIPTION OF EMBODIMENTS

Hereinafter, embodiments of the present disclosure are described in detail with reference to the accompanying drawings.

FIG. 1 illustrates a jig for a secondary battery cell test according to an embodiment of the present disclosure. FIG. 2 illustrates major components of the jig for a secondary battery cell test according to an embodiment of the present disclosure. Furthermore, FIGS. 3 and 4 illustrate forms of the jig for a secondary battery cell test illustrated in FIG. 2, which are viewed from the top and side thereof.

Referring to FIGS. 1 to 4, a jig 100 for a second battery cell test according to an embodiment of the present disclosure includes a main body 110, a first connection unit 120, a second connection unit 130, a third connection unit 140, and a flexible connection unit 150.

The main body 110 forms an appearance of the jig 100 for a second battery cell test according to an embodiment of the present disclosure. The main body 110 forms a rectangular parallelepiped appearance having a pair of short sides that face each other and a pair of long sides that face each other. The main body 110 provides a space in which the first connection unit 120, the second connection unit 130, the third connection unit 140, and the flexible connection unit 150 are disposed.

The first connection unit 120 is disposed on one side of the main body 110. The first connection unit 120 is disposed in a short side portion on one side of the main body 110, among the pair of short sides that face each other. That is, the first connection unit 120 is installed in a first short side S1 that is perpendicular to the length direction (i.e., long-side direction) of the main body 110, and is electrically connected to the positive electrode terminal or negative electrode terminal of a secondary battery cell (not illustrated). The first connection unit 120 is maintained in the state in which the first connection unit 120 has been fixed to the main body 110 in the first short side S1 of the main body 110.

The second connection unit 130 is disposed to face the first connection unit 120 on the main body 110. That is, the second connection unit 130 is disposed to face the first connection unit 120 in a second short side S2 that faces the first short side S1 of the main body 110.

The first connection unit 120 and the second connection unit 130 are electrically connected to the positive electrode terminal and negative electrode terminal of the secondary battery cell (not illustrated), that is, a charging and discharging test target, respectively. The first connection unit 120 and the second connection unit 130 may be used for an electrical connection of a bidirectional secondary battery cell that is disposed in both directions in which the positive electrode terminal and the negative electrode terminal are opposite to each other.

In this case, any one of the first connection unit 120 and the second connection unit 130 may be connected to the positive electrode terminal or negative electrode terminal of the secondary battery cell. Furthermore, any one of the first connection unit 120 and the third connection unit 140 may be connected to a positive electrode connection cable 182 or negative electrode connection cable 184 of a charger and discharger 180 for charging and discharging tests on the secondary battery cell.

For example, the first connection unit 120 may be connected to the positive electrode terminal of the secondary battery cell, and the second connection unit 130 may be connected to the negative electrode terminal of the secondary battery cell. In this case, the first connection unit 120 connected to the positive electrode terminal of the secondary battery cell may be connected to the positive electrode connection cable 182 of the charger and discharger 180.

The first connection unit 120 is maintained in the state in which the first connection unit has been fixed on the main body 110, whereas the second connection unit 130 is installed movably with respect to the first connection unit 120. That is, the second connection unit 130 is installed movably on the main body 110 so that the second connection unit becomes close to or distant from the first connection unit 120 that the second connection unit 130 faces.

The second connection unit 130 is installed to slidably move in the length direction of the main body 110 along a pair of guide shafts 160 that is installed to be parallel to the length direction (i.e., Y axis direction) of the main body 110. In this case, the pair of guide shafts 160 may be installed in a structure in which the pair of guide shafts horizontally penetrates a base frame BF, which is disposed at the bottom of the second connection unit 130.

As described above, the pair of guide shafts 160 that horizontally penetrates the second connection unit 130 and that is installed on the main body 110 plays a role to provide guidance so that the second connection unit 130 can slidably move along an accurate movement trajectory when the second connection unit 130 slides and moves. That is, the pair of guide shafts 160 enables the second connection unit 130 to always slidably move along a predetermined movement trajectory without moving left and right or vertically during a process of the second connection unit 130 horizontally moving.

Accordingly, after an interval between the first connection unit 120 and the second connection unit 130 is adjusted by moving the second connection unit 130 in a horizontal direction so that the interval is identical with the length of the secondary battery cell, that is, a test target, charging and discharging tests may be performed on the secondary battery cell by connecting the positive electrode and negative electrode terminal of the secondary battery cell to the first connection unit 120 and the second connection unit 130, respectively. During this process, the pair of guide shafts 160 improves the mobility of the second connection unit 130 and also improves current connectivity between the secondary battery cell and the connection units 120 and 130 on both sides thereof by guiding the second connection unit 130 so that the second connection unit is moved along an accurate movement trajectory.

The third connection unit 140 is disposed to neighbor the first connection unit 120 in the first short side S1 of the main body 110 in which the first connection unit 120 is disposed. The third connection unit 140 is formed to form one body along with the first connection unit 120 at a location that neighbors the first connection unit 120, and is maintained in the state in which the third connection unit 140 has been fixed to the main body 110 like the first connection unit 120.

The first connection unit 120 and the third connection unit 140 are used for an electrical connection of a unidirectional secondary battery cell having a positive electrode terminal and a negative electrode terminal that are disposed in the same direction. In this case, the first connection unit 120, the second connection unit 130, and the third connection unit 140 have the same part construction and operation structure except that locations where the first connection unit 120, the second connection unit 130, and the third connection unit 140 are installed on the main body 110 are different.

The flexible connection unit 150 connects the second connection unit 130 and the third connection unit 140 so that the second connection unit 130 and the third connection unit 140 are electrically conductable. That is, the flexible connection unit 150 connects the second connection unit 130 and the third connection unit 140 that are diagonally disposed on the main body 110 so that the second connection unit 130 and the third connection unit 140 are electrically conductable.

The flexible connection unit 150 includes flexible busbars 151 and 153 having flexibility that allows some section thereof to be deformable.

The flexible connection unit 150 includes the first flexible busbar 151 and the second flexible busbar 153 that are deformable, and a conductive plate 152 that connects the first flexible busbar 151 and the second flexible busbar 153.

The first flexible busbar 151 is disposed to be parallel to the length direction (i.e., Y axis direction) of the main body 110 between the first connection unit 120 and the second connection unit 130. The first flexible busbar 151 has one end connected to the second connection unit 130 and the other end connected to the conductive plate 152 that is fixed to an upper part of the bottom of the main body 110.

That is, the end of the first flexible busbar 151 on one side thereof is connected to a protrusion part of a lower gripper 132 of the second connection unit 130, which is exposed downward from the base frame BF. The end of the first flexible busbar 151 on the other side thereof is connected to the conductive plate 152 that is installed on a location that is spaced from the bottom of the main body 110 to an upper part thereof at a predetermined height.

The second flexible busbar 153 is disposed to be parallel along with the first flexible busbar 151 in an area in which the third connection unit 140 is disposed. The second flexible busbar 153 has one end connected to the third connection unit 140 and the other end connected to the conductive plate 152.

That is, the end of the second flexible busbar 153 on one side thereof is connected to a protrusion part of the lower gripper 142 of the third connection unit 140, which is exposed downward from the base frame BF. The end of the second flexible busbar 153 on the other side thereof is connected to the conductive plate 152.

Accordingly, the second connection unit 130 and the third connection unit 140 may be electrically connected through the first flexible busbar 151, the conductive plate 152, and the second flexible busbar 153 that are each composed of a conductor and are connected.

In this case, the conductive plate 152 is disposed in a direction that is orthogonal to the first flexible busbar 151 and the second flexible busbar 153. That is, the conductive plate 152 is disposed in an X axis direction of the main body 110 and supported through a plurality of supports 154 that is fixed on the bottom of the main body 110. The conductive plate 152 electrically connects the first flexible busbar 151 and the second flexible busbar 153 that are disposed at isolated locations. The first flexible busbar 151 and the second flexible busbar 153 that are connected through the conductive plate 152 are disposed at upper parts that are spaced apart from the bottom of the main body 110 at a predetermined distance, so that the first flexible busbar 151 and the second flexible busbar 153 do not come into contact with the bottom of the main body 110.

The jig 100 for a secondary battery cell test includes a third flexible busbar 172 that is disposed under the first connection unit 120 and that is deformable. The third flexible busbar 172 is disposed under the first connection unit 120, and has one end connected to the charger and discharger 180 and the other end connected to the first connection unit 120. That is, the end of the third flexible busbar 172 on one side thereof is connected to the positive electrode connection cable 182 or negative electrode connection cable 184 of the charger and discharger 180. The end of the third flexible busbar 172 on the other side thereof is connected to a protrusion part of the lower gripper 122 of the first connection unit 120, which is exposed downward from the base frame BF. Accordingly, the first connection unit 120 may be electrically connected to the external charger and discharger 180 through the medium of the third flexible busbar 172.

The second and third flexible busbars 153 and 172 are deformed upward or downward during a process of lower grippers 122 and 142 that are included in the first and third connection units 120 and 140, respectively, being moved in the vertical direction, and can absorb movement displacements of the lower grippers 122 and 142, respectively. At this time, a situation, such as a connection failure, never occurs because the second and third flexible busbars 153 and 172 are maintained in the state in which the second and third flexible busbars 153 and 172 always electrically come into contact with the lower grippers 122 and 142 while the lower grippers 122 and 142 included in the first and third connection units 120 and 140 are moved in the vertical direction.

FIG. 5 exemplifies a structure of a flexible busbar that is adopted in the jig for a secondary battery cell test according to an embodiment of the present disclosure.

As illustrated in FIG. 5, some area of each of the first to third flexible busbars 151, 153, and 172 that are installed within the main body 110 of the jig 100 for a secondary battery cell test is constructed in a freely deformable form.

That is, each of the first to third flexible busbars 151, 153, and 172 may be formed to have a structure in which both ends 151*a* and 151*b* that are connected to each of the first to third connection units 120, 130, and 140, the conductive plate 152, and the charger and discharger 180 do not have flexibility and a part except the both ends 151*a* and 151*b* has flexibility that allows the part to be freely deformable.

Each of the first to third flexible busbars 151, 153, and 172 may be formed to have a braided wire busbar or shunt busbar structure. For example, each of the first to third flexible busbars 151, 153, and 172 may be formed in the form of a braided wire busbar in which several thin copper lines are twisted in the form of a wide plane and terminals for an electrical contact are constructed at both ends of the plane or a shunt busbar in which several deformable thin laminate plane copper plates are overlaid. The flexible busbar that is formed in such a form is suitable for charging and discharging tests for a high current because the flexible busbar has high current efficiency per cross section, and can suppress an excessive temperature rise within the main body 110 in which the flexible bars are installed because the amount of heat generated from the flexible busbar is small.

In this case, each of the first to third flexible busbars 151, 153, and 172 may be surrounded by an insulating sheath so that each of the first to third flexible busbars is prevented from electrically coming into contact with other structures within the main body 110 during a process of each of the first to third flexible busbars being deformed upward or downward.

The first to third flexible busbars 151, 153, and 172 enable a current to be stably supplied from a low current band to a high current band (up to 2000 A) when the charger and discharger 180 supplies the current to the secondary battery cell. Furthermore, the first to third flexible busbars 151, 153, and 172 are each formed to have a thin plate-shaped structure, and can simply and compactly construct a current supply line from the charger and discharger 180 to the first to third connection units 120, 130, and 140 while optimizing the utilization of a space within the main body 110.

FIG. 6 illustrates a form in which the second connection unit has been moved in the horizontal direction along the guide shaft in the jig for a secondary battery cell test according to an embodiment of the present disclosure.

In the jig 100 for a secondary battery cell test according to an embodiment of the present disclosure, the interval between the first connection unit 120 and the second connection unit 130 may be adjusted so that the interval becomes identical with the length of the secondary battery cell, that is, a test target. That is, as illustrated in FIG. 6, after the interval between the first connection unit 120 and the second connection unit 130 is adjusted to become identical with the length of the secondary battery cell by moving the second connection unit 130 along the pair of guide shafts 160, charging and discharging tests may be performed on the secondary battery cell by engaging the positive electrode and negative electrode terminal of the secondary battery cell with the first connection unit 120 and the second connection unit 130, respectively.

In this case, during a process of the second connection unit 130 being horizontally moved, the first flexible busbar 151 is deformed upward or downward and can absorb a movement displacement of the second connection unit 130. Furthermore, a situation, such as an electrical connection failure between the second connection unit 130 and the first flexible busbar 151, never occurs because the first flexible busbar 151 always maintains the state in which the first flexible busbar has been coupled with the second connection unit 130 and the conductive plate 152 while the second connection unit 130 is horizontally moved.

FIG. 7 illustrates a detailed form of the first and third connection units in the jig for a secondary battery cell test according to an embodiment of the present disclosure and a detailed diagram specifically illustrating connection structures of the first to third flexible busbars. FIG. 8 is a cross-sectional view illustrating cross section structures of the first connection unit and the third connection unit.

Referring to FIGS. 7 and 8, the first connection unit 120 and the third connection unit 140 that are formed to neighbor each other in the first short side S1 of the main body 110 are formed to form one body in one structure form.

The first connection unit 120 and the third connection unit 140 include an upper gripper 121 and the lower gripper 122 that come into contact with the positive electrode terminal or negative electrode terminal of the secondary battery cell on upper and lower parts thereof, respectively, a gripper mounting frame IF in which the lower gripper 122 is seated and with which the upper gripper 121 is coupled so that the upper gripper is movable up and down, the base frame BF through which the lower gripper 122 penetrates and with which the gripper mounting frame IF is coupled so that the gripper mounting frame is movable up and down, and gripper mounting frame height adjustment members 124 and

144 capable of adjusting the up and down height of the gripper mounting frame IF with respect to the base frame BF.

Specifically, the first connection unit 120 includes the upper gripper 121 and the lower gripper 122 that are mounted to be movable up and down in the internal space of the gripper mounting frame IF.

Furthermore, the first connection unit 120 includes a gripper interval adjustment member 123 that is coupled with the top of the gripper mounting frame IF and that adjusts an interval between the upper gripper 121 and the lower gripper 122.

The upper gripper 121 is disposed at an upper part of the internal space of the gripper mounting frame IF, and is connected to the bottom of the gripper interval adjustment member 123.

A screw thread is formed on the outer circumferential surface of the gripper interval adjustment member 123. The gripper interval adjustment member 123 is coupled with the top of the gripper mounting frame IF by a screw fastening method. The bottom of the gripper interval adjustment member 123 is rotatably supported by the upper gripper 121. Accordingly, when the gripper interval adjustment member 123 is rotated clockwise or counterclockwise, the gripper interval adjustment member 123 may rise or drop. The upper gripper 121 connected to the gripper interval adjustment member 123 may also be raised or dropped.

The lower gripper 122 is disposed under the upper gripper 121 in the internal space of the gripper mounting frame IF. The top of the lower gripper 122 is seated on the bottom of the internal space of the gripper mounting frame IF. The lower gripper 122 has the protrusion part that is exposed downward from the base frame BF through the gripper mounting frame IF and the base frame BF.

The positive electrode terminal or negative electrode terminal of the secondary battery cell may be connected to the upper gripper 121 and the lower gripper 122 by being engaged therebetween. The gripper interval adjustment member 123 may widen or narrow the interval between the upper gripper 121 and the lower gripper 122 by raising or dropping the upper gripper 121.

An end of the third flexible busbar 172 on one side thereof is fixed on the main body 110 and connected to the positive electrode connection cable 182 or negative electrode connection cable 184 of the charger and discharger 180. An end of the third flexible busbar 172 on the other side thereof is connected to the protrusion part of the lower gripper 122, which is exposed downward from the base frame BF.

The gripper mounting frame height adjustment member 124 may adjust the up and down height of the gripper mounting frame IF with respect to the base frame BF. The gripper mounting frame height adjustment member 124 includes a bolt shaft **124*a* and a rotary knob 124*b*. A screw thread is formed on the outer circumferential surface of the bolt shaft 124*a*, and thus the bolt shaft 124*a* is screwed onto the gripper mounting frame IF. The bottom 124*c* of the bolt shaft 124*a* is rotatably supported by the base frame BF. The rotary knob 124*b* is coupled with the top of the bolt shaft 124*a*** over the gripper mounting frame IF.

Accordingly, as illustrated in FIG. 9, when the rotary knob **124*b* is rotated in one direction, the gripper mounting frame IF is raised as the bolt shaft 124*a* supported by the base frame BF is rotated. When the rotary knob 124*b* is rotated in an opposite direction, the gripper mounting frame IF is dropped. As described above, the height of the gripper mounting frame IF can be adjusted by the rotation of the rotary knob 124*b***, and thus the heights of the upper gripper 121 and the lower gripper 122 that are engaged with the secondary battery cell can be adjusted. Accordingly, charging and discharging tests can be easily performed on secondary battery cells having various thicknesses in the state in which the secondary battery cell has been engaged between the upper gripper 121 and the lower gripper 122.

The third connection unit 140 includes an upper gripper 141 and the lower gripper 142 that are mounted to be movable up and down in the internal space of the gripper mounting frame IF.

Furthermore, the third connection unit 140 includes a gripper interval adjustment member 143 that is coupled with the top of the gripper mounting frame IF and that adjusts an interval between the upper gripper 141 and the lower gripper 142.

The upper gripper 141 is disposed at the upper part of the internal space of the gripper mounting frame IF, and is connected to the bottom of the gripper interval adjustment member 143.

A screw thread is formed on the outer circumferential surface of the gripper interval adjustment member 143. The gripper interval adjustment member 143 is coupled with the top of the gripper mounting frame IF by a screw fastening method. The bottom of the gripper interval adjustment member 143 is rotatably supported by the upper gripper 141. Accordingly, when the gripper interval adjustment member 143 is rotated clockwise or counterclockwise, the gripper interval adjustment member 143 may rise or drop, and the upper gripper 141 connected to the gripper interval adjustment member 143 may also be raised or dropped.

The lower gripper 142 is disposed under the upper gripper 141 in the internal space of the gripper mounting frame IF. The top of the lower gripper 142 is seated on the bottom of the internal space of the gripper mounting frame IF. The lower gripper 142 has a protrusion part that is exposed downward from the base frame BF through the gripper mounting frame IF and the base frame BF.

The positive electrode terminal or negative electrode terminal of the secondary battery cell may be connected to the upper gripper 141 and the lower gripper 142 by being engaged therebetween. The gripper interval adjustment member 143 may widen or narrow the interval between the upper gripper 141 and the lower gripper 142 by raising or dropping the upper gripper 141. In this case, the protrusion part of the lower gripper 142, which is exposed downward from the base frame BF, is connected to an end of the second flexible busbar 153 on one side thereof.

The third connection unit 140 includes the gripper mounting frame height adjustment member 144 capable of adjusting the up and down height of the gripper mounting frame IF. The gripper mounting frame height adjustment member 144 includes a bolt shaft 144*a* and a rotary knob 144*b*. A screw thread is formed on the outer circumferential surface of the bolt shaft 144*a*. The bolt shaft 144*a* is screwed onto the gripper mounting frame IF. The bottom 144*c* of the bolt shaft 144*a* is rotatably supported by the base frame BF. The rotary knob 144*b* is coupled with the top of the bolt shaft 144*a* over the gripper mounting frame IF.

Accordingly, when the rotary knob 144*b* is rotated in one direction, the gripper mounting frame IF is raised as the bolt shaft 144*a* supported by the base frame BF is rotated. When the rotary knob 144*b* is rotated in an opposite direction, the gripper mounting frame IF is dropped. As described above, the height of the gripper mounting frame IF can be adjusted by the rotation of the rotary knob 144*b*, and thus the heights of the upper gripper 141 and the lower gripper 142 with which the secondary battery cell is engaged can be adjusted.

Accordingly, charging and discharging tests can be easily performed on secondary battery cells having various thicknesses in the state in which the secondary battery cell has been engaged between the upper gripper 141 and the lower gripper 142.

A connection plate 174 that is connected to the positive electrode connection cable 182 or negative electrode connection cable 184 of the charger and discharger 180 and that is electrically connected to the conductive plate 152 is disposed under the third connection unit 140. An end of the connection plate 174 on one side thereof is fixed on the main body 110 and connected to the positive electrode connection cable 182 or negative electrode connection cable 184 of the charger and discharger 180. An end of the connection plate 174 on the other side thereof is connected to the conductive plate 152.

In this case, the end of the connection plate 174 that is connected to the conductive plate 152 is fastened to the conductive plate 152 in the state in which the end of the connection plate 174 has overlapped the end of the second flexible busbar 153, so that the connection plate 174 is electrically connected to the second flexible busbar 153 and the conductive plate 152. Furthermore, as the conductive plate 152 is connected to the first flexible busbar 151, a current can be supplied to the second flexible busbar 153 and the first flexible busbar 151 through the connection plate 174 connected to the connection cable of the charger and discharger 180.

Accordingly, the current that is supplied from the charger and discharger 180 to the connection plate 174 can be supplied to the third connection unit 140 via the second flexible busbar 153, and can be supplied to the second connection unit 130 via the first flexible busbar 151 that is connected to the connection plate 174 through the medium of the conductive plate 152.

The second connection unit 130 includes an upper gripper 131 and the lower gripper 132 that are mounted to be movable up and down in the internal space of the gripper mounting frame IF. Furthermore, the second connection unit 130 includes a gripper interval adjustment member 133 that is coupled with the top of the gripper mounting frame IF and that adjusts an interval between the upper gripper 131 and the lower gripper 132. In this case, a protrusion part of the lower gripper 132, which is exposed downward from the base frame BF, is connected to an end of the first flexible busbar 151 on one side thereof. The second connection unit 130 further includes a gripper mounting frame height adjustment member 134 capable of adjusting the up and down height of the gripper mounting frame IF. Furthermore, the gripper mounting frame height adjustment member 134 includes a bolt shaft 134*a* and a rotary knob 134*b*. The second connection unit 130 has a basic construction that is the same as that of each of the first connection unit 120 and the third connection unit 140 except that a location where the second connection unit 130 is disposed on the main body 110 is different. Accordingly, a detailed description of a detailed construction and operation of the second connection unit 130 is omitted.

As described above, in the jig 100 for a secondary battery cell test according to an embodiment of the present disclosure, the gripper contact part of each of the first to third connection units 120, 130, and 140 that are connected to the electrode terminal of a secondary battery cell has a structure in which the gripper contact part is freely adjusted in the vertical direction. Accordingly, there is an advantage in that charging and discharging tests can be easily performed on secondary battery cells having various thicknesses, such as a secondary battery cell having a barrier rib that maintains an interval between unit batteries or a secondary battery not having a separate barrier rib, by connecting the secondary battery cell to the gripper contact parts of the first to third connection units 120, 130, and 140 regardless of whether the barrier rib is present.

FIG. 10 illustrates an example in which an indication member to indicate the gradation of the base frame has been installed when the height of the gripper mounting frame is adjusted by the rotary knob.

Referring to FIG. 10, the jig 100 for a secondary battery cell test includes an indication member 190 that indicates the height of the gripper mounting frame IF so that a user can check an accurate height of the gripper mounting frame IF when the height of the gripper mounting frame IF is adjusted by the rotary knob 124*b*.

To this end, gradation G that enables a user to check an accurate height of the gripper mounting frame IF according to an up and down movement of the gripper mounting frame IF through his or her eyes is formed on one side of an external surface of the base frame BF. Furthermore, the indication member 190 that indicates the location of the gradation G formed on the external surface of the base frame BF is mounted on the gripper mounting frame IF.

The indication member 190 includes a first indication member 192 and a second indication member 194 each having a plate shape having a "¬" (or "L") shape.

The first indication member 192 is fixed to a side part of the top of the gripper mounting frame IF, which is adjacent to one side of the base frame BF in which the gradation G has been engraved. In this case, a fixing portion of the first indication member 192, which is fixed to the gripper mounting frame IF, is formed to have a wide width, and an indication portion of the first indication member 192, which indicates the gradation G, is formed to have a narrow width.

Furthermore, the indication portion of the first indication member 192 is disposed to be parallel to the moving direction (i.e., the vertical direction) of the gripper mounting frame IF. An arrow design 193 is formed at the bottom of the indication portion so that the location of the gradation G is accurately indicated. Accordingly, when the height of the gripper mounting frame IF is changed, an accurate height of the gripper mounting frame IF can be measured by reading the gradation G that is indicated by the arrow design 193 at the bottom of the indication portion of the first indication member 192.

The second indication member 194 is fixed to the gripper mounting frame IF so that the second indication member 194 indicates the gradation G engraved in the base frame BF at the bottom of the first indication member 192. In this case, a fixing portion of the second indication member 194, which is fixed to the gripper mounting frame IF, is formed to have a wide width, and an indication portion of the second indication member 194, which indicates the gradation G, is formed to have a narrow width.

Furthermore, the indication portion of the second indication member 194 is disposed to be vertical to the indication portion of the first indication member 192. That is, the indication portion of the second indication member 194 is disposed in the horizontal direction that is perpendicular to the moving direction of the gripper mounting frame IF. In this case, the bottom of the indication portion of the second indication member 194 is formed so that an extension line of the bottom is disposed at a location identical with the bottom of the indication portion of the first indication member 192. Furthermore, an arrow design 195 is formed at the end of the indication portion of the second indication member 194 so that the arrow design 195 accurately indicates the location of the gradation G.

Accordingly, when the height of the gripper mounting frame IF is changed, a user can measure an accurate height of the gripper mounting frame IF by reading the gradation G that is indicated by the arrow design 195 at the end of the indication portion of the second indication member 194. Furthermore, as the indication portion of the second indication member 194 is disposed in the horizontal direction that is perpendicular to the moving direction (i.e., the vertical direction) of the gripper mounting frame IF, a user can easily check whether the gripper mounting frame IF is in the horizontal state by checking whether the arrow design 195 marked in the indication portion of the second indication member 194 is parallel to a gradation mark of the gradation G.

As the indication member 190 capable of indicating the gradation G of the base frame BF is installed in the gripper mounting frame IF as described above, a user can accurately adjust the heights of the grippers of the connection units 120, 130, and 140 in the vertical direction, while checking the numerical value of the gradation G on the external surface of the base frame BF through the indication member 190 that is mounted on the gripper mounting frame IF, when adjusting the heights of the grippers 121 and 122 by using the rotary knob 124*b*. Accordingly, a user's inconvenience to adjust the heights of the grippers of the connection units 120, 130, and 140 while measuring the heights of the grippers one by one by using a ruler when charging and discharging tests are performed on a secondary battery cell can be reduced. Furthermore, the time taken for setting work of the jig can be greatly reduced. Furthermore, there is an advantage in that charging and discharging tests having higher reliability can be performed.

As described above, the jig 100 for a secondary battery cell test according to an embodiment of the present disclosure can perform charging and discharging tests on a secondary battery cell by adjusting the interval between the first connection unit 120 and the second connection unit 130 to the length of the secondary battery cell having a bidirectional terminal because the second connection unit 130 is constructed to be movable in the horizontal direction along the pair of guide shafts 160, and can perform charging and discharging tests on a secondary battery cell by adjusting the heights of the grippers of the first to third connection units 120, 130, and 140 to the thickness of a secondary battery cell having a unidirectional terminal because the grippers of the first to third connection units 120, 130, and 140 are constructed to be movable in the vertical direction (i.e., the Y axis direction). As described above, the jig 100 for a secondary battery cell test according to an embodiment of the present disclosure has an advantage in that charging and discharging tests can be performed on secondary battery pouch cells having a unidirectional terminal and a bidirectional terminal and various specifications (e.g., a length and a thickness) by using the structure of the one jig 100 for a secondary battery cell test.

Furthermore, in the jig 100 for a secondary battery cell test according to an embodiment of the present disclosure, during a process of the contact part (gripper) of each connection unit, which is connected to the positive electrode terminal or negative electrode terminal of a secondary battery cell, being moved in the horizontal direction or vertical direction, the flexible busbar that is connected to the connection unit absorbs a movement displacement of the contact part of the connection unit, while being deformed, and continuously maintains the state in which the flexible busbar has been electrically connected to the connection unit. Accordingly, charging and discharging tests can be always stably performed on the secondary battery.

In particular, the existing jig structure has a problem in that a connection failure occurs because a contact deviation between the connection unit and the busbar occurs due to poor flatness of the busbar or an assembly tolerance between parts because the connection unit of a jig that is connected to the terminal of a secondary battery cell is moved in the horizontal direction while physically coming into contact with the top of the busbar having a flat plate form. In contrast, in the jig 100 for a secondary battery cell test according to an embodiment of the present disclosure, charging and discharging tests can be always stably performed on a secondary battery cell without a connection failure because the first flexible busbar 151 maintains the state in which the first flexible busbar 151 is always electrically connected to the second connection unit 130 even during a process of the second connection unit 130 being moved in the horizontal direction.

Furthermore, the jig 100 for a secondary battery cell test according to an embodiment of the present disclosure is constructed so that the height of each gripper that is engaged with the terminal of a secondary battery cell can be freely adjusted through the rotary knob included in each connection unit. Accordingly, charging and discharging tests can be performed on various types of secondary battery cells by connecting the secondary battery cells to the connection unit regardless of the height of the terminal of the secondary battery cell. Furthermore, workability according to the charging and discharging tests can also be improved.

Furthermore, when the height of the gripper is adjusted by using the rotary knob, the heights of the grippers in the vertical direction, which are included in the connection units, respectively, can be accurately adjusted through the indication member mounted on the gripper mounting frame, while accurately checking the location of the gradation on the external surface of the base frame. Accordingly, it is possible to reduce the time taken for setting work for charging and discharging tests on a secondary battery cell, to improve workability for the charging and discharging tests, and to enable more reliable test work.

Although the embodiments of the present disclosure have been described above, the scope of the present disclosure is not limited to only such specific embodiments, and a person having ordinary knowledge in a corresponding field may properly change the present disclosure without departing from the category of the claims of the present disclosure.

DESCRIPTION OF REFERENCE NUMERALS

100: jig for secondary battery cell test
110: main body 120: first connection unit
121, 131, 141: upper gripper
122, 132, 142: lower gripper
123, 133, 143: gripper interval adjustment bolt
124, 134, 144: gripper mounting frame height adjustment member
124*a*, 134*a*, 144*a*: bolt shaft
124*b*, 134*b*, 144*b*: rotary knob
130: second connection unit 140: third connection unit
150: flexible connection unit 151: first flexible busbar
152: conductive plate 153: second flexible busbar
160: guide shaft 172: third flexible busbar
174: connection plate 180: charger and discharger
190: indication member BF: base frame
IF: gripper mounting frame

The invention claimed is:

1. A jig for a secondary battery cell test, comprising:
a main body;
a first connection unit disposed in the main body and connected to a secondary battery cell;
a second connection unit disposed to face the first connection unit, installed to be movable so that the second connection unit becomes close to or distant from the first connection unit, and connected to the secondary battery cell;
a third connection unit disposed to neighbor the first connection unit and connected to the secondary battery cell; and
a flexible connection unit comprising at least one flexible busbar that is deformable and configured to connect the second connection unit and the third connection unit so that the second connection unit and the third connection unit are electrically conductable,
wherein each of the first to third connection units comprises:
an upper gripper and a lower gripper configured to come into contact with a terminal of the secondary battery cell on upper and lower parts thereof, respectively;
a gripper mounting frame in which the lower gripper is seated and with which the upper gripper is coupled so that the upper gripper is movable up and down;
a base frame through which the lower gripper penetrates and with which the gripper mounting frame is coupled so that the gripper mounting frame is movable up and down; and
a gripper mounting frame height adjustment member configured to adjust an up and down height of the gripper mounting frame with respect to the base frame.

2. The jig of claim 1, wherein the flexible connection unit comprises:
a first flexible busbar configured to be deformable and to have one end connected to the second connection unit and the other end connected to a conductive plate that is fixed to an upper part of a bottom of the main body, and
a second flexible busbar configured to be deformable and to have one end connected to the third connection unit and the other end connected to the conductive plate.

3. The jig of claim 1, further comprising a third flexible busbar disposed under the first connection unit and configured to be deformable and to have one end connected to an external charger and discharger and the other end connected to the first connection unit.

4. The jig of claim 1, further comprising a connection plate disposed under the third connection unit and configured to have one end connected to an external charger and discharger and the other end connected to the third connection unit.

5. The jig of claim 1, further comprising a pair of guide shafts installed in a length direction of the main body and configured to provide guidance to a movement of the second connection unit.

6. The jig of claim 1, wherein the gripper mounting frame height adjustment member comprises:
a bolt shaft configured to have a screw thread formed on an outer circumferential surface thereof, screwed onto the gripper mounting frame, and configured to have a bottom rotatably supported by the base frame; and
a rotary knob coupled with a top of the bolt shaft in an upper part of the gripper mounting frame.

7. The jig of claim 1, wherein a gradation through which a height of the gripper mounting frame according to the up and down movement of the gripper mounting frame is able to be checked is formed on an external surface of the base frame.

8. The jig of claim 1, wherein an indication member to indicate a location of a gradation formed on an external surface of the base frame is mounted on the gripper mounting frame.

9. The jig of claim 8, wherein the indication member comprises:

a first indication member disposed in parallel to a moving direction of the gripper mounting frame and configured to indicate the location of the gradation; and a second indication member that is disposed to be perpendicular to the first indication member and through which the location of the gradation and a horizontal state of the gripper mounting frame are able to be checked.

* * * * *